United States Patent
Zachara et al.

(10) Patent No.: US 12,114,421 B2
(45) Date of Patent: Oct. 8, 2024

(54) ANTENNA APPLICATION IN WIRELESS EARPHONES

(71) Applicant: Shure Acquisition Holdings, Inc., Niles, IL (US)

(72) Inventors: Christopher Zachara, Williamsburg, VA (US); Truong Vu Luu, Morton Grove, IL (US); Christopher Richard Knipstein, Chicago, IL (US)

(73) Assignee: Shure Acquisition Holdings, Inc., Niles, IL (US)

( * ) Notice: Subject to any disclaimer, the term of this patent is extended or adjusted under 35 U.S.C. 154(b) by 0 days.

(21) Appl. No.: 18/138,437

(22) Filed: Apr. 24, 2023

(65) Prior Publication Data

US 2023/0262878 A1 Aug. 17, 2023

Related U.S. Application Data

(62) Division of application No. 17/344,110, filed on Jun. 10, 2021, now Pat. No. 11,672,078.

(Continued)

(51) Int. Cl.
  *H05K 1/02* (2006.01)
  *H01Q 1/24* (2006.01)
  *H04R 1/10* (2006.01)

(52) U.S. Cl.
  CPC .......... *H05K 1/0243* (2013.01); *H01Q 1/241* (2013.01); *H04R 1/1016* (2013.01); *H04R 1/1033* (2013.01); *H04R 2420/07* (2013.01)

(58) Field of Classification Search
  CPC .... H05K 1/0243; H01Q 1/241; H04R 1/1016; H04R 1/1033; H04R 2420/07
  See application file for complete search history.

(56) References Cited

U.S. PATENT DOCUMENTS 4,876,709 A * 10/1989 Rogers ............... H01Q 1/243
   455/575.7
7,652,628 B2  1/2010 Zweers
(Continued)

FOREIGN PATENT DOCUMENTS

CN  206370492 U  8/2017
CN  206379458 U  8/2017
(Continued)

OTHER PUBLICATIONS

Translation of Cn207039829 (Year: 2018).*
(Continued)

*Primary Examiner* — Andrew Sniezek
(74) *Attorney, Agent, or Firm* — Banner & Witcoff, Ltd.

(57) ABSTRACT

A wireless earphone incorporates a wire antenna having a form factor driven innovative antenna shape that minimizes antenna detuning caused by user interactions with the earphones. The wire shape, diameter, and distance of the wire antenna from the printed circuit board (PCB) are selected for an acceptable tradeoff between antenna bandwidth and radiated efficiency. By inserting an end through a through-hole of the PCB, the wire antenna is electrically connected to a multi-layer PCB without traditional approaches such as springs, pogo pins, and the like. An antenna holder further secures the antenna within a thin profile housing for precise placement and manufacturing consistency. A PCB-specific RF VIA geometry is also utilized for partial impedance matching of a transmission line to the wire antenna. In addition, a more constant impedance is maintained along the transmission line connecting a radio device with the wire antenna.

20 Claims, 15 Drawing Sheets

Related U.S. Application Data

(60) Provisional application No. 63/038,972, filed on Jun. 15, 2020.

(56) References Cited

U.S. PATENT DOCUMENTS

| | | |
|---|---|---|
| 8,803,760 B2 | 8/2014 | Chakam et al. |
| 8,878,735 B2 | 11/2014 | Kvist et al. |
| 9,680,209 B2 | 6/2017 | Troelsen et al. |
| 9,949,014 B2 | 4/2018 | Cramer et al. |
| 10,129,635 B1 | 11/2018 | Zhu et al. |
| 10,206,026 B2 | 2/2019 | Yeung et al. |
| 10,219,084 B2 | 2/2019 | Meskens et al. |
| 10,244,303 B2 | 3/2019 | Xu et al. |
| 10,334,373 B2 | 6/2019 | Troelsen et al. |
| 10,764,666 B1 | 9/2020 | Napoles et al. |
| 2008/0119138 A1 | 5/2008 | Kim et al. |
| 2008/0143610 A1 | 6/2008 | Wang et al. |
| 2011/0122034 A1 | 5/2011 | Kim |
| 2017/0064830 A1 | 3/2017 | Jiang et al. |
| 2017/0188163 A1 | 6/2017 | Rabel et al. |
| 2018/0077484 A1 | 3/2018 | Yeung et al. |
| 2019/0103661 A1 | 4/2019 | Cousins et al. |
| 2020/0015023 A1 | 1/2020 | Abadia et al. |
| 2020/0091590 A1 | 3/2020 | Su et al. |

FOREIGN PATENT DOCUMENTS

| | | | |
|---|---|---|---|
| CN | 206471479 U | | 9/2017 |
| CN | 206894849 U | | 1/2018 |
| CN | 206993370 U | | 2/2018 |
| CN | 207039829 U | * | 2/2018 |
| CN | 207082628 U | | 3/2018 |
| CN | 104333826 B | | 2/2019 |
| CN | 110165378 A | * | 8/2019 |
| CN | 110323542 A | | 10/2019 |
| CN | 209627637 U | | 11/2019 |
| CN | 210016598 U | | 2/2020 |
| EP | 3200270 A1 | | 8/2017 |
| JP | H9214223 A | | 8/1997 |
| JP | 2017147566 A | | 8/2017 |
| KR | 20070040950 A | | 4/2007 |
| WO | 2014088224 A1 | | 6/2014 |
| WO | 2019120134 A1 | | 6/2019 |
| WO | 2019130843 A1 | | 7/2019 |
| WO | 2020005818 A1 | | 1/2020 |

OTHER PUBLICATIONS

Translation of CN110165378 (Year: 2019).*
Sep. 21, 2021—(WO) Partial International Search Report and Written Opinion—App PCT/US21/36907.
Nov. 10, 2021—(WO) International Search Report and Written Opinion—App PCT/US21/36907.
Wong, et al., "Study of the Bluetooth Headset Antenna with the User's Head", Microwave and Optical Technology Letters 1 10.1002/mop.22047 I DeepDyve, <https://www.deepdyve.com/lp/wiley/study-of-the-bluetooth-headseBluetooth%2Bheadset%2Bantenna%2Bwith%2Bthe%2Buser%2527s%2Bhead>, 6 pgs, Mar. 27, 2020.
LDS Antenna Design, Taoglas, 1 pg.
Jun. 6, 2022—(TW) English Translation of Search Report Appn 110121617.

* cited by examiner

ANTENNA APPLICATION IN WIRELESS EARPHONES

This application is a divisional of U.S. patent application Ser. No. 17/344,110, filed Jun. 10, 2021, which claims priority to U.S. Provisional Application No. 63/038,972, filed Jun. 15, 2020, the disclosures of which are incorporated herein by reference in their entirety.

TECHNICAL FIELD

One or more aspects of the disclosure generally relate to an antenna application in wireless earphones. The wireless earphones may operate at a desired frequency spectrum, for example, Bluetooth frequency range (approximately 2.402 GHz to 2.480 GHz).

BACKGROUND

Unlike a traditional wired earphone, wireless earphones provide an untethered connection to a paired content source. Consequently, user movement is constrained only by the bounds of a communication channel between the wireless earphone and the content source. In addition, wireless earphones are typically situated close to a user's body since the wireless earphones operate near, on, or within the user's ears. For example, wireless earphone operating within the Bluetooth spectrum (approximately 2.40-2.48 GHz) may incur transmission degradation when a user places his/her hand near the wireless earphones because the electrical permittivity of the human body is very high. This degradation often results in received signal dropping and the extracted audio content being disrupted.

In light of the above observations, the performance of wireless earphones may be enhanced with respect to traditional approaches by improving the robustness of the communication channel between the wireless earphones and the paired communication device.

SUMMARY

This summary is provided to introduce a selection of concepts in a simplified form that are further described below in the Detailed Description. This Summary is not intended to identify key features or essential features of the disclosure.

A wireless earphone incorporates a wire antenna having a form factor driven innovative antenna shape that minimizes antenna detuning caused by user interactions with earphones. The wire shape, diameter, and distance of the wire antenna attached to the printed circuit board (PCB) are optimized for a desired tradeoff between antenna bandwidth and radiated efficiency.

With another aspect of the disclosure, a wire antenna is electrically connected to a multi-layer PCB without traditional approaches such as springs, pogo pins, and the like. The electrical connection is reliable and low cost while supporting a PCB specific RF VIA geometry that can be utilized for partial impedance matching of the wireless earphones to the antenna.

With another aspect of the disclosure, an antenna holder provides precise placement of a wire antenna with respect to a PCB and corresponding electrical components for precise placement and manufacturing consistency important to antenna performance. High antenna performance results in a robust communication channel between wireless earphones and the paired device. Moreover, dielectric material may be selectively removed from the antenna holder to reduce dielectric losses in the wire antenna.

With another aspect of the disclosure, a wireless earphone includes a multi-layer printed circuit board (PCB) having a plurality of PCB layers, an antenna assembly comprising a wire antenna, and an impedance matching interface. The wire antenna has an end inserted through a through-hole of the multi-layer PCB and is electrically connected to top and bottom pads. The wireless earphone is partially matched to the antenna impedance by an electrical interaction between the end of the wire antenna and the plurality of PCB layers.

With another aspect of the disclosure, an impedance matching interface comprises a shunt capacitor, where the wireless earphone is further matched to the antenna impedance by the shunt capacitor.

With another aspect of the disclosure, a wireless earphone includes a microstrip (transmission line) that electrically connects a radio device to a wire antenna via an impedance matching interface. An electrical component (for example, a surface mounted filtering device) that has a corresponding pad is often located along the microstrip. Because the corresponding pad may be wider than that of the microstrip, the characteristic impedance along the microstrip changes. In order to mitigate the impedance change, at least a portion of the ground plane below the electrical component on the adjacent PCB layer may be cut out.

BRIEF DESCRIPTION OF THE DRAWINGS

A more complete understanding of the exemplary embodiments of the present invention and the advantages thereof may be acquired by referring to the following description in consideration of the accompanying drawings, in which like reference numbers indicate like features and wherein.

DETAILED DESCRIPTION

In the following description of the various exemplary embodiments, reference is made to the accompanying drawings which form a part hereof, and in which is shown by way of illustration various embodiments in which the invention may be practiced. It is to be understood that other embodiments may be utilized and structural and functional modifications may be made without departing from the scope of the present invention.

Aspects of the embodiments are directed to a wireless earphone interacting with a content source (paired device) over a one-way or bi-directional communication channel. Embodiments may support different types of paired devices, including but not limited to, smart phones, media players, car radios, and the like. Moreover, embodiments may support Bluetooth operation that typically utilize frequencies between 2.400 to 2.4835 GHz, However, embodiments may support other wireless services that operate in conjunction with Wi-Fi and the Internet of Things (IoT) utilizing different wireless spectra.

Figure 1:
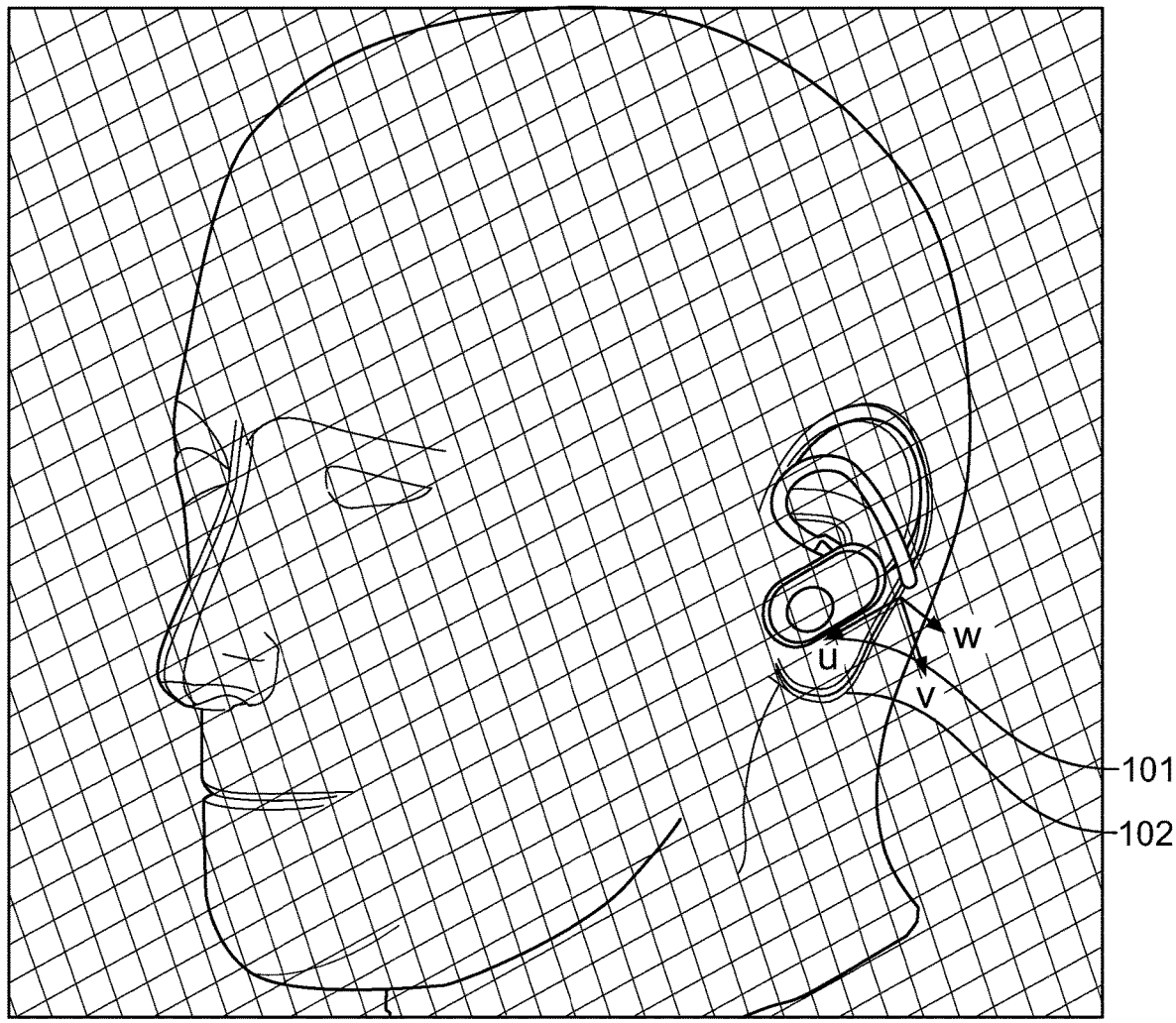
FIG. 1 shows a wireless earphone worn by a user in accordance with an aspect of the embodiments.

With traditional approaches, earphones utilizing Bluetooth operation often encounter degraded operation resulting from its electrical characteristics being affected by a user's proximity. Degraded operation of the communication channel may cause the wireless signal to be disrupted, resulting in content at the wireless earphone being lost. Referring to FIG. 1, wireless earphones 101 are typically close to the user's body since the earphones are worn near, on, or in the user's ear 102. For example, when the user moves his/her hand near earphones 101, the performance of an internal antenna (not explicitly shown) may be adversely affected since a human body is characterized a high electrical permittivity (typically 40-60). In general, any human body part should stay away from the antenna. As will be discussed, aspects of the embodiments address this concern.

Figure 2:
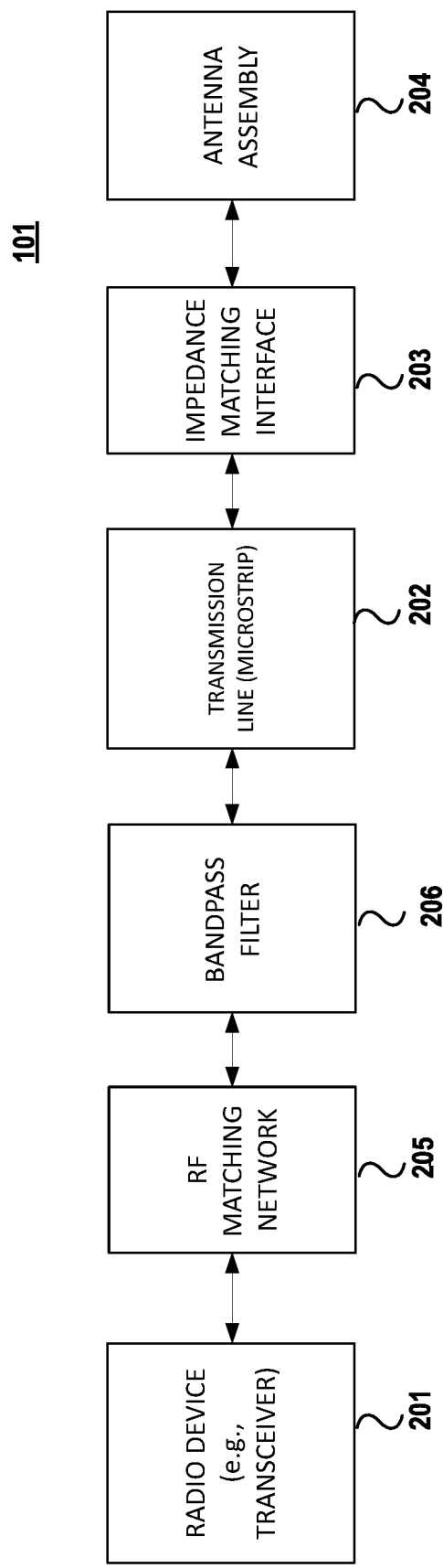
FIG. 2 shows components of a wireless earphone that support a communication channel between the wireless earphone and a paired device in accordance with an aspect of the embodiments.

FIG. 2 shows components of a wireless earphone that support a communication channel between wireless earphone 101 and a paired device (not explicitly shown) in accordance with an aspect of the embodiments. Embodiments may support a bi-directional (two-way) channel or a one-way (from paired device to wireless earphone 101).

With some embodiments, earphone 101 comprises radio device 201, transmission line (microstrip) 202, impedance matching interface 203, and antenna assembly 204.

Radio device 201 (which may comprise an RF transceiver or only a receiver) processes a received wireless signal obtained from antenna assembly 204 through RF matching network 205, band pass filter (BPF) 206, and transmission line 202. Radio device 201 is often designed to operate at an impedance of 50 ohms; however, antenna assembly 204 is characterized by an antenna impedance different from 50 ohms. Consequently, impedance matching interface 203 more closely matches antenna assembly 204 with radio device 201. Impedance matching interface 203 will be discussed in greater detail with FIG. 7.

When radio device 201 comprises a wireless transceiver, a wireless signal may be generated to support a communication in the reverse direction from wireless earphone 101 to the paired device. For example, an acknowledgement (ACK) or configuration information may be sent to the pair device to control the content flow to wireless earphone 101.

Figure 8:
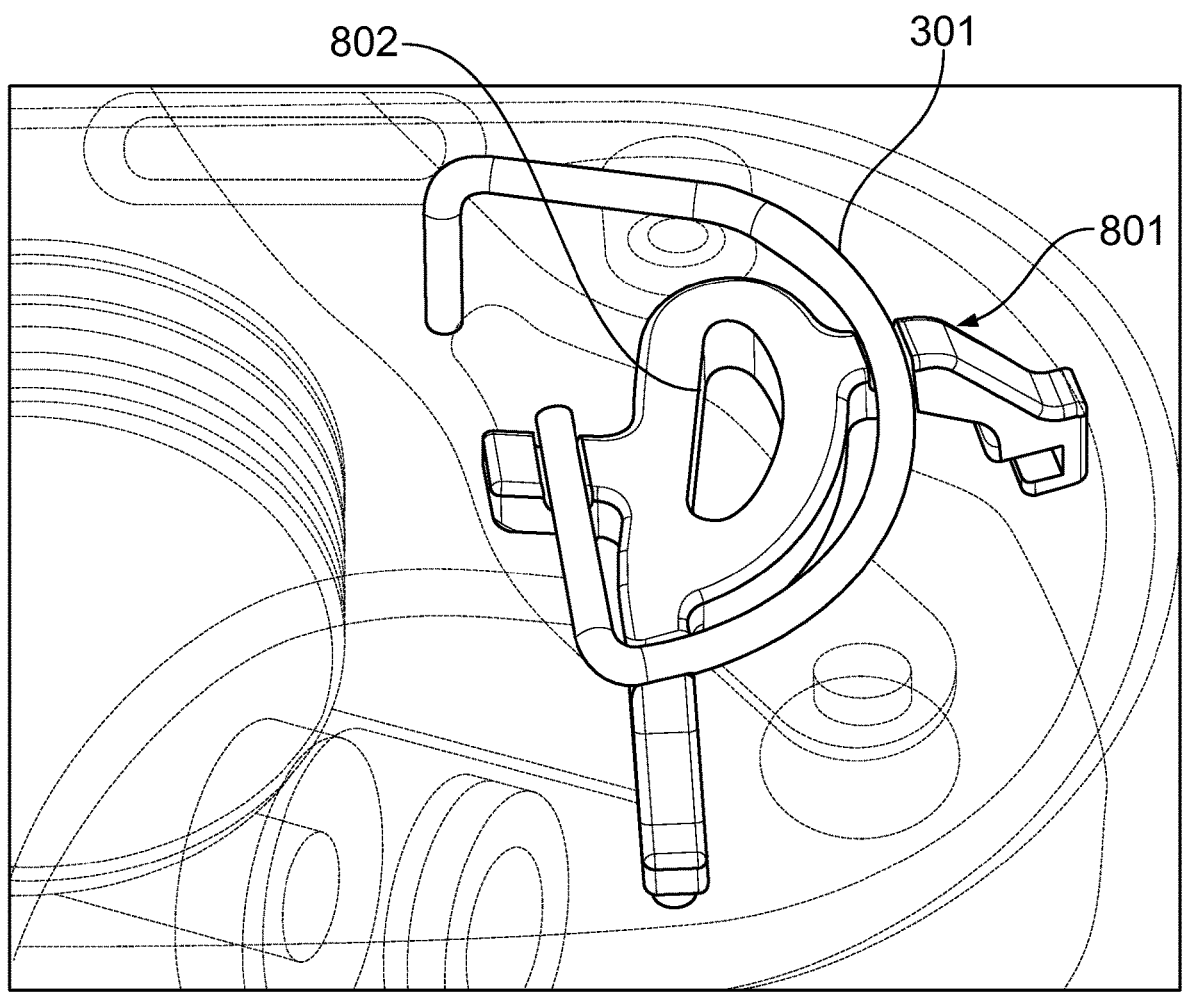
FIG. 8 shows a wire antenna positioned by an antenna holder in accordance with an aspect of the embodiments.

Earphone 101 sends and/or receives a wireless signal at antenna assembly 204. As will be discussed, antenna 204 may comprise a wire antenna (for example 301 as shown in FIG. 8) that is held in place by antenna holder 801.

Figure 3:
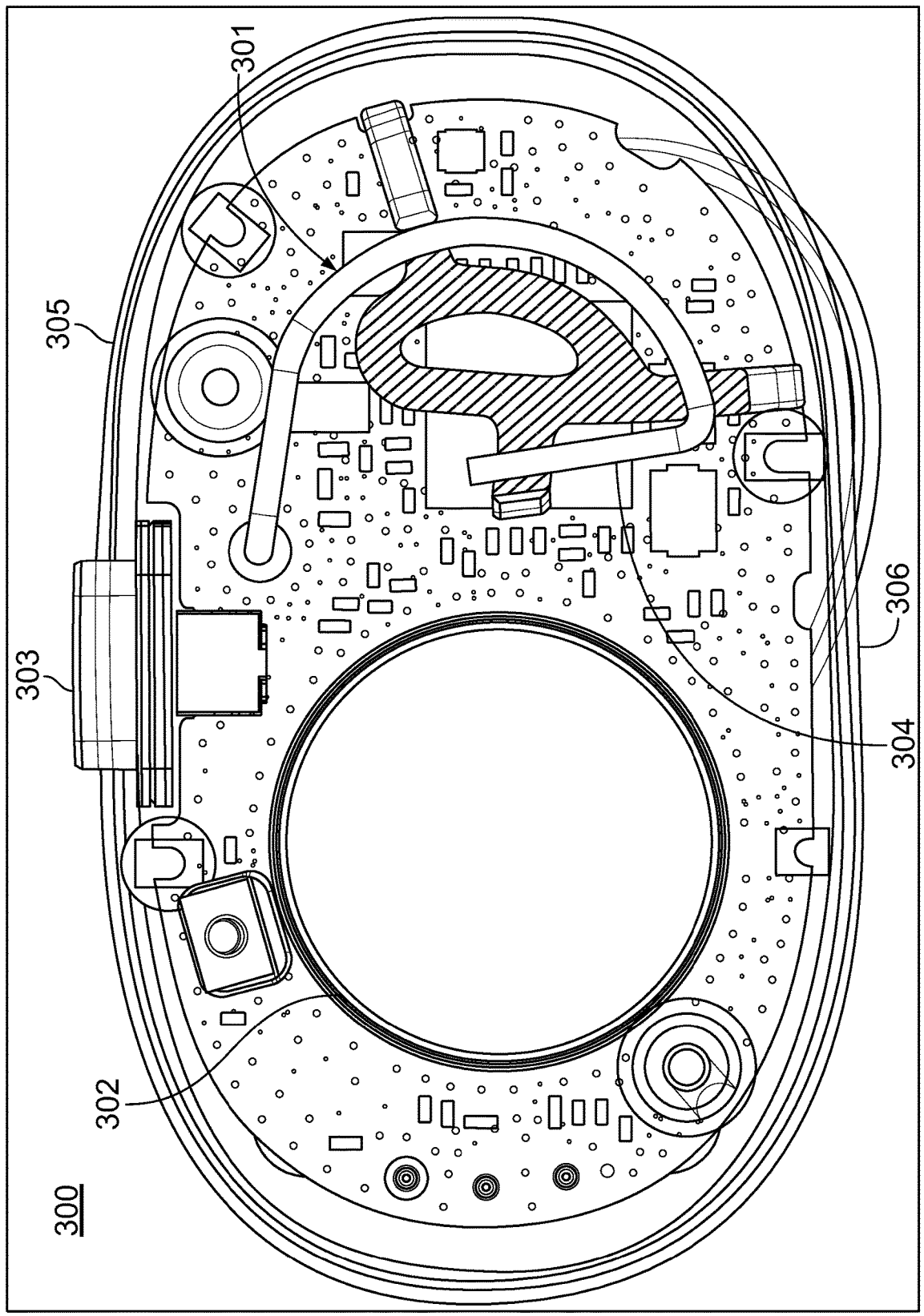
FIG. 3 shows a view of a printed circuit board (PCB) of a wireless earphone in accordance with an aspect of the embodiments.

FIG. 3 shows view 300 of a printed circuit board (PCB) of wireless earphone 101 in accordance with an aspect of the embodiments. As shown in FIG. 1, earphone 101 is typically worn by a user, where button 303 is in the upward direction. The user can then depress button 303 pushing it with one finger and supporting the bottom of earphone 101 with the thumb (for example at region 306), which does not significantly degrade the performance of wire antenna 301.

With some embodiments, as shown in FIG. 3, wire antenna 301 incorporates an innovative antenna shape that minimizes antenna detuning caused by user interactions with the earphones. Antenna 301 has a wire length required for proper resonance at the approximate center frequency of the desired spectrum, where the length is slightly longer than a quarter wavelength. For Bluetooth operation, the center frequency is approximately 2.44 GHz.

Because antenna 301 is constrained to be located within a thin-profile housing of wireless earphone 101, antenna 301 is bent to be approximately parallel to the PCB and shaped to curve around the right side of housing 305. Antenna 301 is also shaped to reduce the effects of human finger loading and detuning effects. Consequently, antenna end 304 is sharply bent to avoid being too close to battery 302 as well as the user's thumb that may be positioned at the bottom. Battery 302 is often the electrical component most adversely affecting antenna 301 (for example, detuning and antenna radiated efficiency loss) because it is relatively large and metallic.

The height of battery 302 is typically comparable to the height of antenna 301, and consequently battery 302 may have a profound effect upon the performance of antenna 301. With traditional approaches, battery 302 is a part of RF ground at the operational frequency. With an aspect of the embodiments, the adverse effect of battery 302 is ameliorated by floating battery 302 at the antenna operating frequency. This may be achieved by inserting RF chokes (inductors) in series for each of the two leads that connects battery 302 to the PCB or any other RF ground components, and may also include all additional control and monitoring connections with the battery. The RF choking may be implemented with ferrite beads that have high impedance at antenna operating frequency range, for example, 2.402 GHz to 2.480 GHz, or narrow band choking with inductors may be selected so that each of the inductors exhibits self-resonance at the mid-band of operational frequency, for example, 2.44 GHz. As one of ordinary skill in the art would appreciate, self-resonance occurs because of capacitance defined by inductor, size, physical construction and type of materials used. Because the impedance of an inductor is very high at self-resonance, battery 302 electrically floats at the operational frequency, thus ameliorating the effect of battery 302 upon the performance of antenna 301.

The distance between antenna 301 and battery 302 is an important consideration. Increasing the distance to battery 302 may result in antenna current cancelation due to wire shape. If this occurs, the performance of antenna 301 is adversely affected. On the other hand, if the distance is too small, the electrical characteristics of antenna 301 are adversely changed by battery 302.

The distance between antenna 301 and the PCB is also an important consideration. Generally, the antenna efficiency increases with the distance. In the embodiment shown in FIG. 3, wire antenna 301 is located within housing 305. It is desirable to have a thin profile; thus this distance is small so that antenna 301 can be located within the housing. If the distance is too small, the efficiency of antenna 301 is adversely affected. In order to increase this distance, the diameter of the wire can be reduced. However, the smaller the wire diameter, the smaller the antenna bandwidth. Thus, there is a tradeoff between the antenna bandwidth and the antenna efficiency, where the wire diameter is selected based on the distance between wire antenna 301 and the PCB.

Based on experimentation and simulations, a tradeoff between the antenna efficiency and the antenna bandwidth is obtained. For example, with the embodiment shown in FIG. 3, the wire diameter of antenna 301 is approximately 0.75 mm and the distance from the bottom of the wire to the PCB is approximately 3.0 mm (corresponding to a distance to diameter ratio of 4.0).

As discussed above, antenna 301 is advantageous with respect to traditional approaches. For example, the form factor of antenna 301 minimizes antenna detuning caused by user interactions with wireless earphones 101. In addition, the antenna wire shape, diameter, and distance of wire antenna 301 from the PCB may be optimized for the best tradeoff between antenna bandwidth and radiated efficiency.

Figure 4:
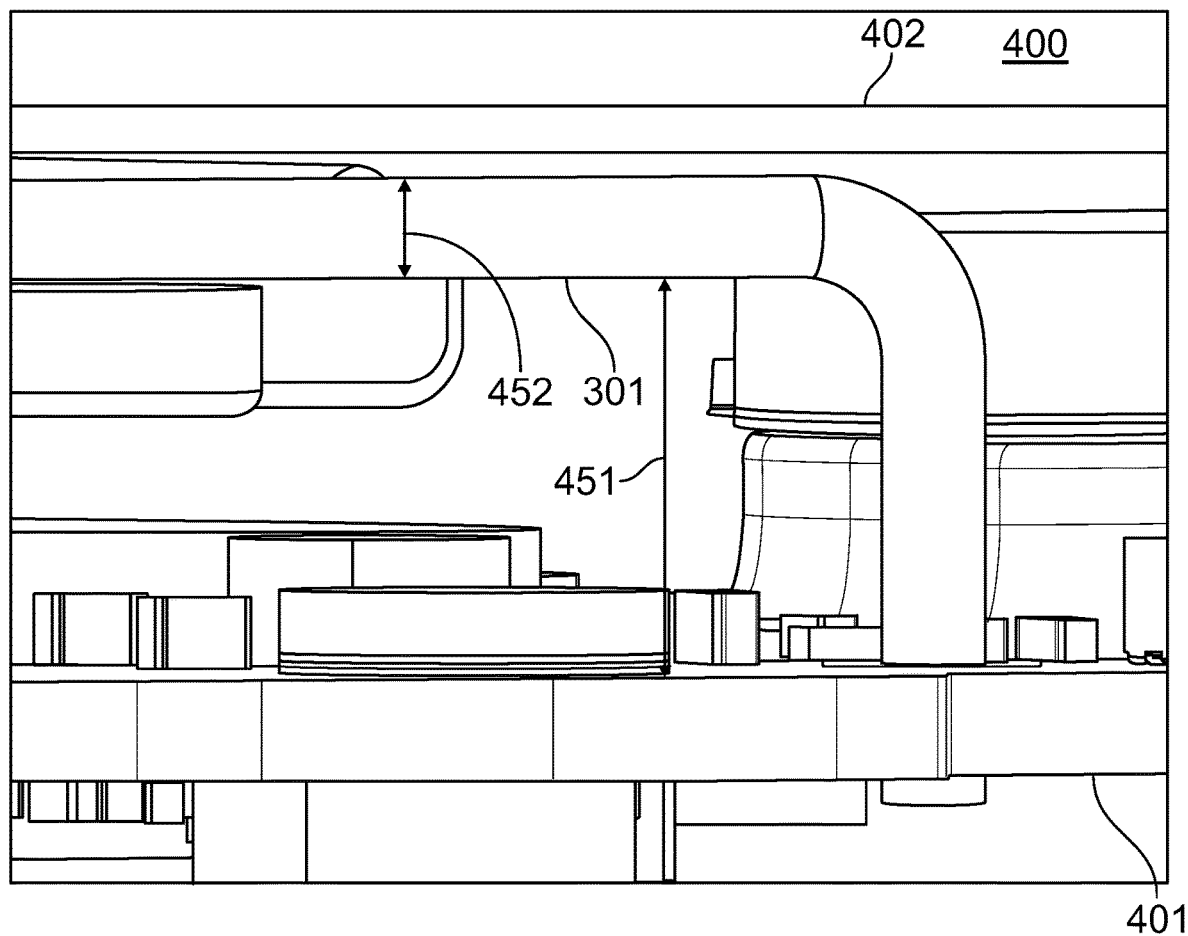
FIG. 4 shows a cross sectional view of a wire antenna incorporated in a wireless earphone in accordance with an aspect of the embodiments.

FIG. 4 shows cross sectional view 400 of wire antenna 301 incorporated in wireless earphone 101 in accordance with an aspect of the embodiments. As shown in FIG. 4, distance 451 (the distance from the bottom of the wire of antenna 301 to PCB 401) is limited by the thin profile of housing 402. Moreover, as wire diameter 452 increases, distance 451 decreases.

As distance 451 decreases (where antenna 301 is brought closer to the ground plane), the antenna efficiency decreases. As wire diameter 452 increases, the antenna bandwidth increases. Wire diameter 452 is selected (optimized) for the best tradeoff between the antenna bandwidth and the radiated efficiency, which are important to the desired performance of wireless earphones 101.

One of ordinary skill in the art will appreciate that engineering judgment may be exercised when selecting distance 451 and wire diameter 452. Alternatively, a desired performance metric may be maximized. For example, a performance metric may be defined as:

$$\text{Performance\_Metric} = W_1 * \text{Bandwidth} + W_2 * \text{Efficiency} \quad (\text{EQ. 1})$$

where the antenna bandwidth and the antenna efficiency are weighted by $W_1$ and $W_2$, respectively.

Figure 5:
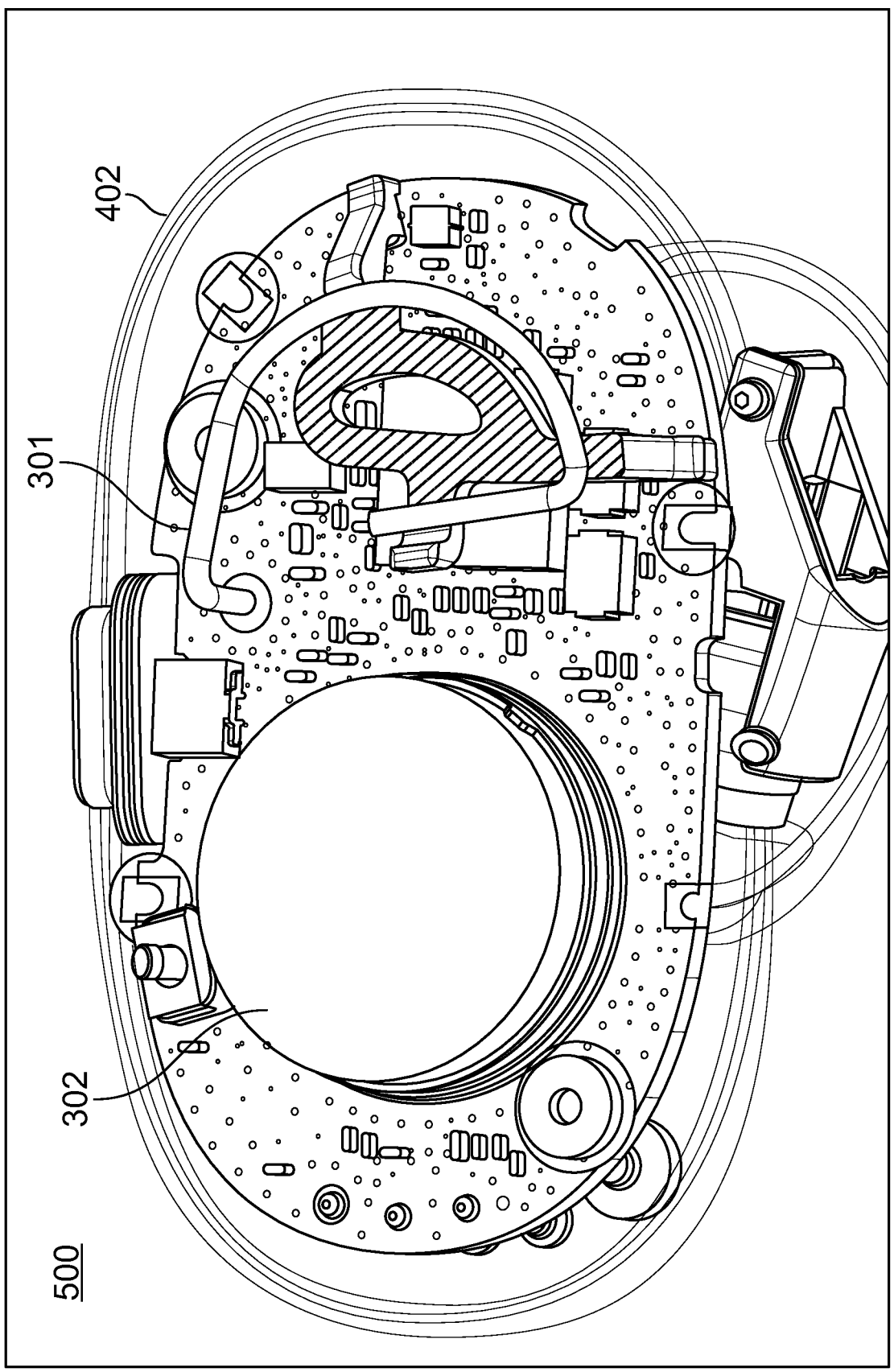
FIG. 5 shows a side view of a wireless earphone in accordance with an aspect of the embodiments.

FIG. 5 shows view 500 of wireless earphone 101 in accordance with an aspect of the embodiments. Battery 302 is often a major cause for antenna performance degradation, for example, when antenna 301 is close to battery 302, the antenna radiation is deteriorated. To mitigate this effect, antenna 301 curves away from battery 302 along housing 402.

Figure 6:
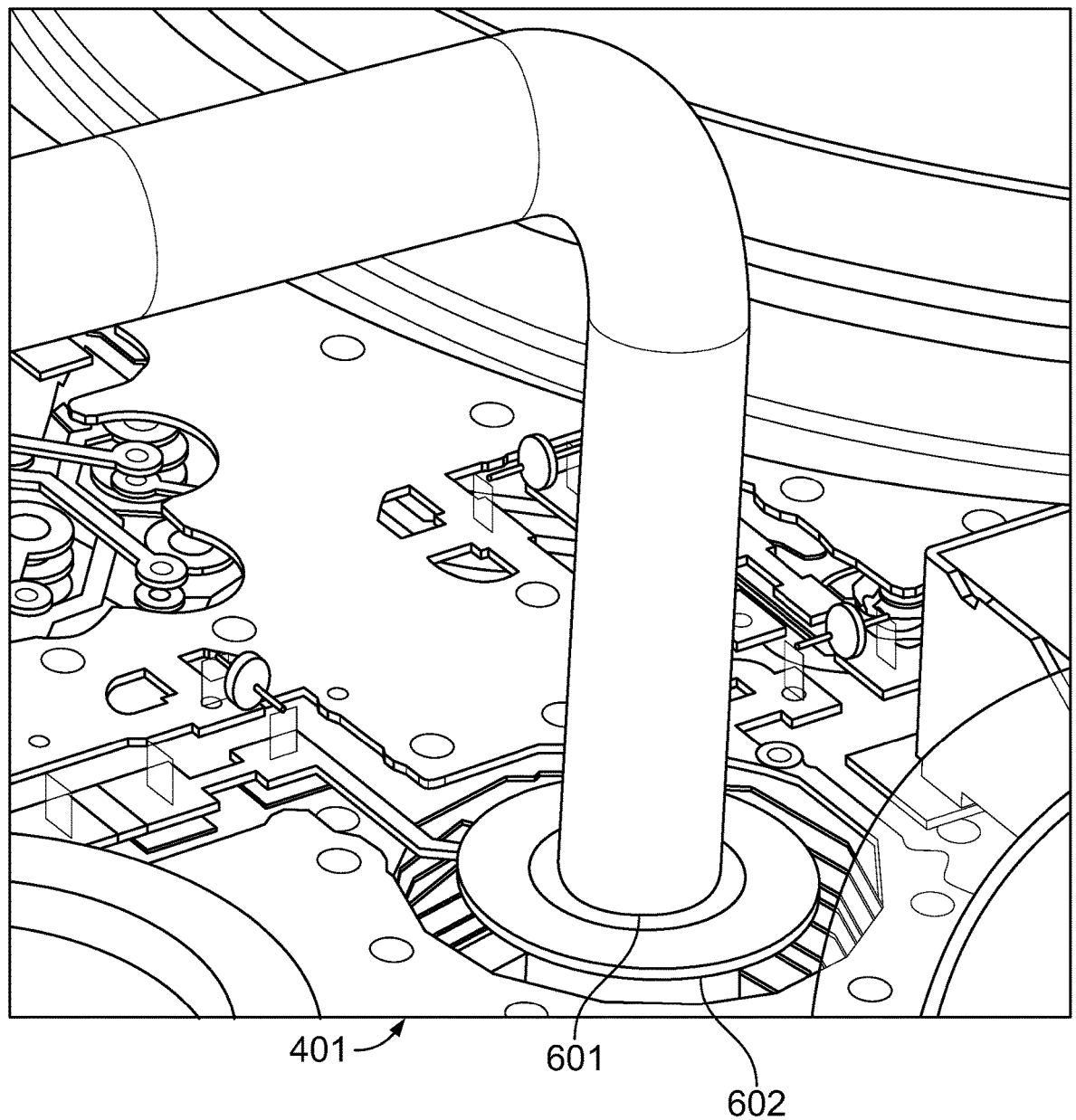
FIG. 6 shows a wire antenna mounted at a PCB through-hole of a wireless earphone in accordance with an aspect of the embodiments.

FIG. 6 shows wire antenna 301 mounted to PCB 401 at through-hole 601 in accordance with an aspect of the embodiments. Traditional approaches often use a pogo pin compressible connector connected between an antenna and a PCB, causing manufacturing reliability problems.

With some embodiments, antenna 301 is soldered to first and second pads on the top and the bottom, respectively, of multi-layer PCB 401. With is approach, a direct connection is established with through-hole 601. Because of the large relative size of antenna 301 with respect to the PCB foil thickness, large and potentially destructive physical forces may occur between antenna 301 and the PCB connections. To address this possible condition, the first and second pads are large with respect to traditional approaches Because PCB 401 typically has thin foils and antenna 301 is large with respect to PCB 401, the first and second pads (where the first pad is shown as pad 602 and the second pad is not explicitly shown) are relatively large to provide mechanical stability and robustness. While this approach is reliable with respect to traditional approaches, it provides a low-cost direct connection. This approach circumvents the need for other more expensive and less reliable traditional approaches such as springs, pogo pins, and so forth.

Figure 7:
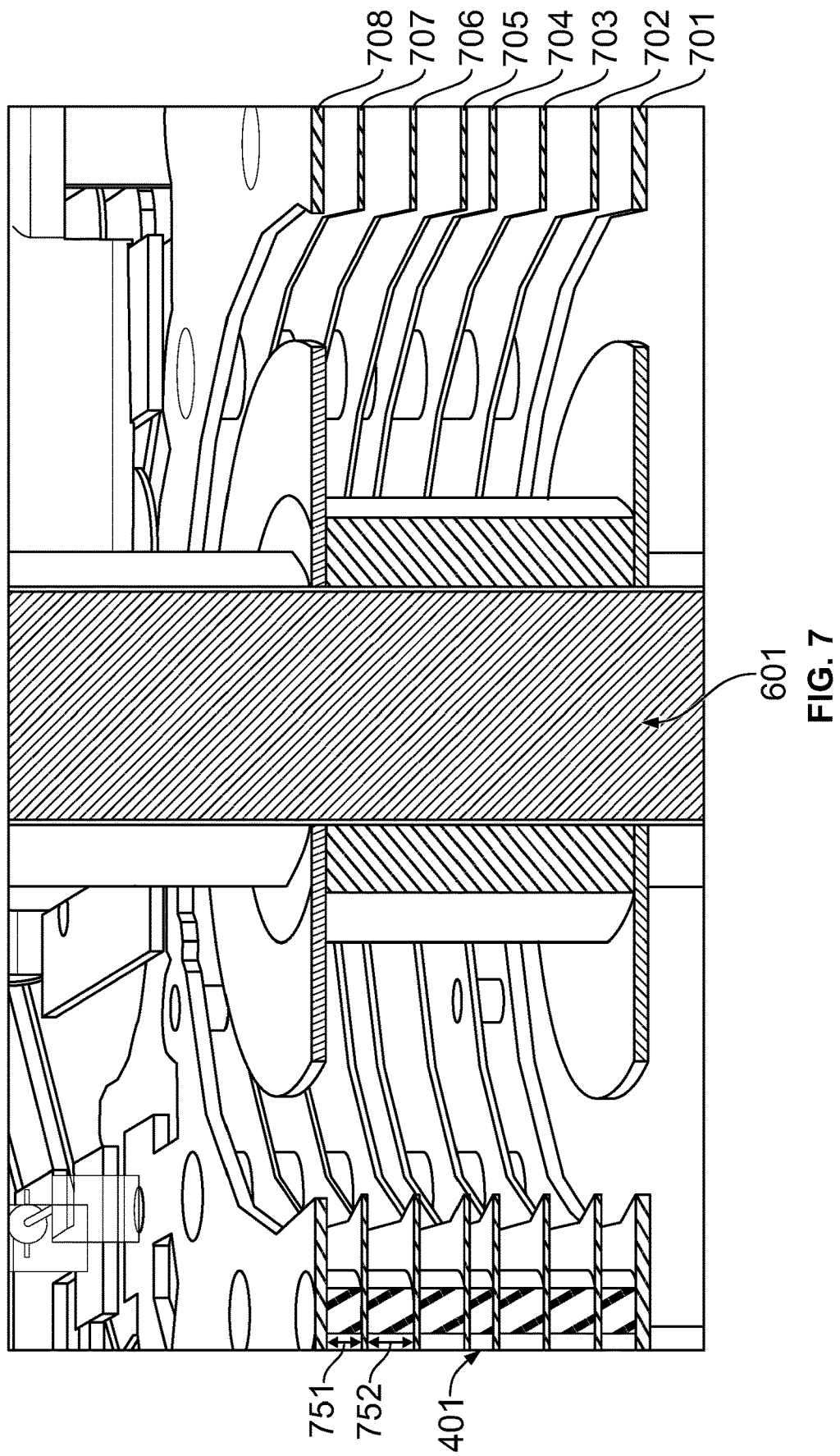
FIG. 7 shows a PCB layer specific VIA PCB stack-up geometry providing partial impedance matching to a wire antenna in accordance with an aspect of the embodiments.

FIG. 7 shows a PCB layer specific VIA PCB stack-up geometry providing partial impedance matching to wire antenna 301 of wireless earphone 101 in accordance with an aspect of the embodiments. As previously discussed, an end of antenna 301 is inserted into through-hole 601 and electrically attached (for example, soldered) to multi-layer PCB 401.

As shown with the embodiment shown in FIG. 7, multi-layer PCB 401 comprises eight PCB layers 701-708, where the top layer is designated as layer 8, the bottom layer is designated as layer 1, and the inner PCB layers are designated as layers 2-7. However, embodiments may support a different number of PCB layers. Adjacent layers are separated by specified distances. For example, layer 8 and layer 7 are separated by distance 751 and layer 7 and layer 6 are separated by distance 752.

The embodiment shown in FIG. 7 provides a reliable and low-cost direct antenna connection as well as a PCB specific RF VIA geometry. As will be discussed, the resulting electrical characteristics of the geometry provides the required RF signal transition and partial impedance matching while eliminating the need for other commonly used and less desirable connection types such as pogo pins.

Electrical interaction between antenna 301 and each PCB layer 701-708 contributes partial impedance matching of antenna 301 to transmission line 202 (not explicitly shown in FIG. 7). For example, the distance between a corresponding pad and the conductive foil at each PCB layer (corresponding to anti-pad or anti-via) provides an impedance contribution that results in the partial impedance value. As will be appreciated by one of ordinary skill in the art, the corresponding electrical effects may be determined by electrical analysis, computer modeling, and/or simulations.

Once the partial impedance matching created by the multi-layer geometry is determined, a shunt capacitor may be included to fine-tune the impedance matching of transmission line 202 to antenna 301. One of ordinary skill in the art will appreciate that impedance matching using distributed electrical characteristics of PCB 401 is preferable with respect to impedance matching only with discrete electrical components because the antenna efficiency is improved.

FIG. 8 shows wire antenna 301 positioned by antenna holder 801 of a wireless earphone in accordance with an aspect of the embodiments. Wire holder 801 enables for precise and consistent antenna mounting of antenna 301 in earphone housing 305 (shown in FIG. 3 but not explicitly shown in FIG. 8).

Antenna holder 801 may provide advantages with respect to traditional approaches. For example, the antenna radiation efficiency may be improved by reducing dielectric losses. Dielectric material may be selectively removed from holder 801. For example, hole 802 may be introduced while maintaining mechanical integrity of holder 801. In addition, holder 801 enables for the precise placement and manufacturing consistency that is important to the improved performance of antenna 301. For example, holder 801 helps to reduce manufacturing process-related resonance frequency variance.

Figure 9:
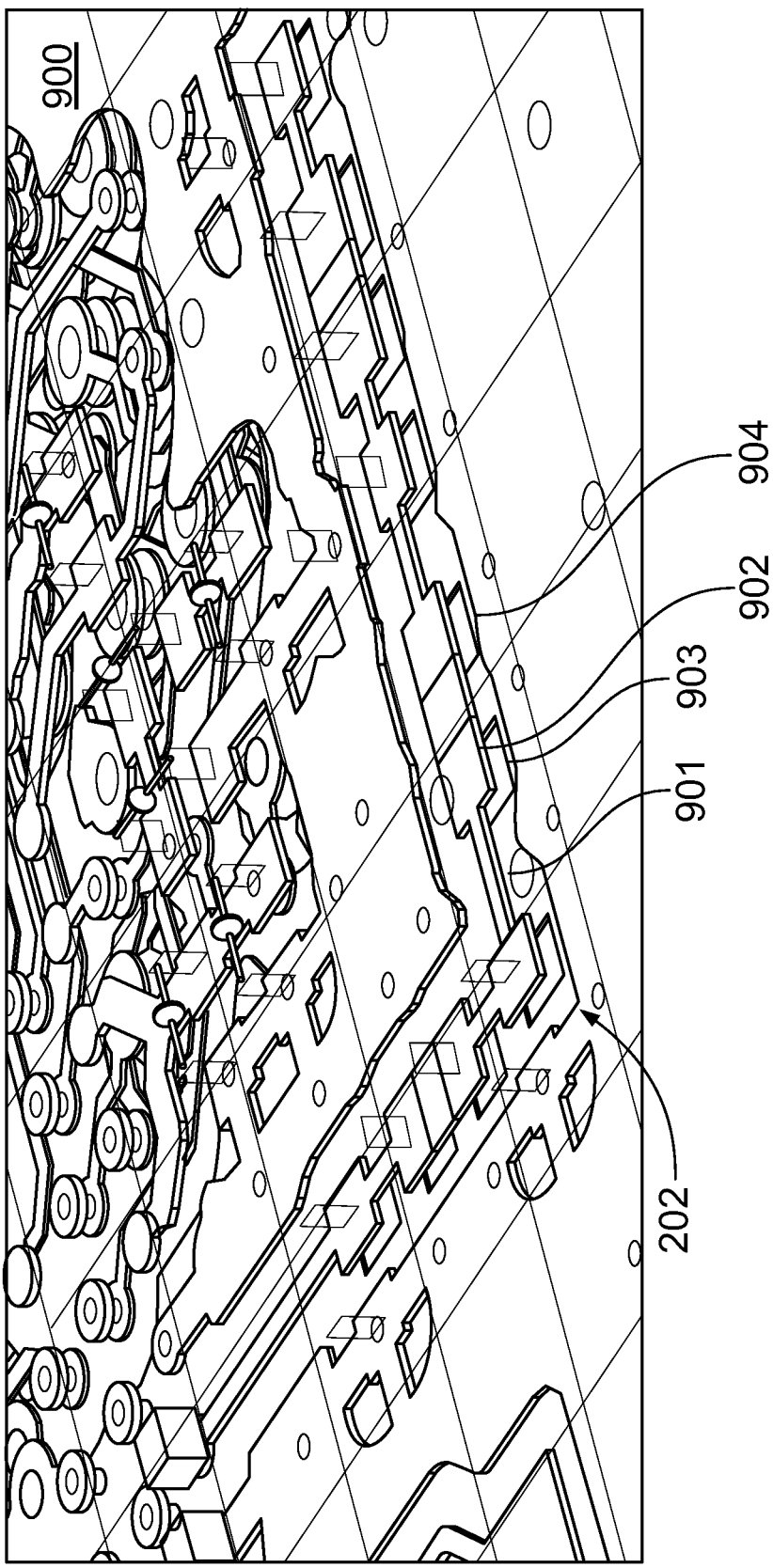
FIG. 9 shows a part of transmission line (microstrip) located on a PCB of a wireless earphone in accordance with an aspect of the embodiments.

FIG. 9 shows microstrip (transmission line) 202 located on a multi-layer PCB of wireless earphone 101 in accordance with an aspect of the embodiments. As previously discussed, microstrip 202 electrically connects a radio device (for example, a surface mounted transceiver chip) to wire antenna 301 (not explicitly shown in FIG. 9).

With some embodiments, PCB 401, as shown in FIG. 7, utilizes high-density interconnects (HDI) technology, where the spacing between layers is very small (for example, 3 to 4 mils). This results in traces being very narrow, where the component pads are a lot bigger than the width of 50 Ohms microstrip traces. With traditional approaches, transitions in the impedance caused by the pads are ignored.

Referring to FIG. 9, section 901 of microstrip 202 is typically designed to match to the impedance of the radio device (typically 50 ohms). However, because the corresponding ground plane is located at layer 7 of the multi-layer PCB (where the separation 751, as shown in FIG. 7, is small—typically several mils), the width of section 901 is quite small to obtain the 50 ohm impedance match.

Figure 10:
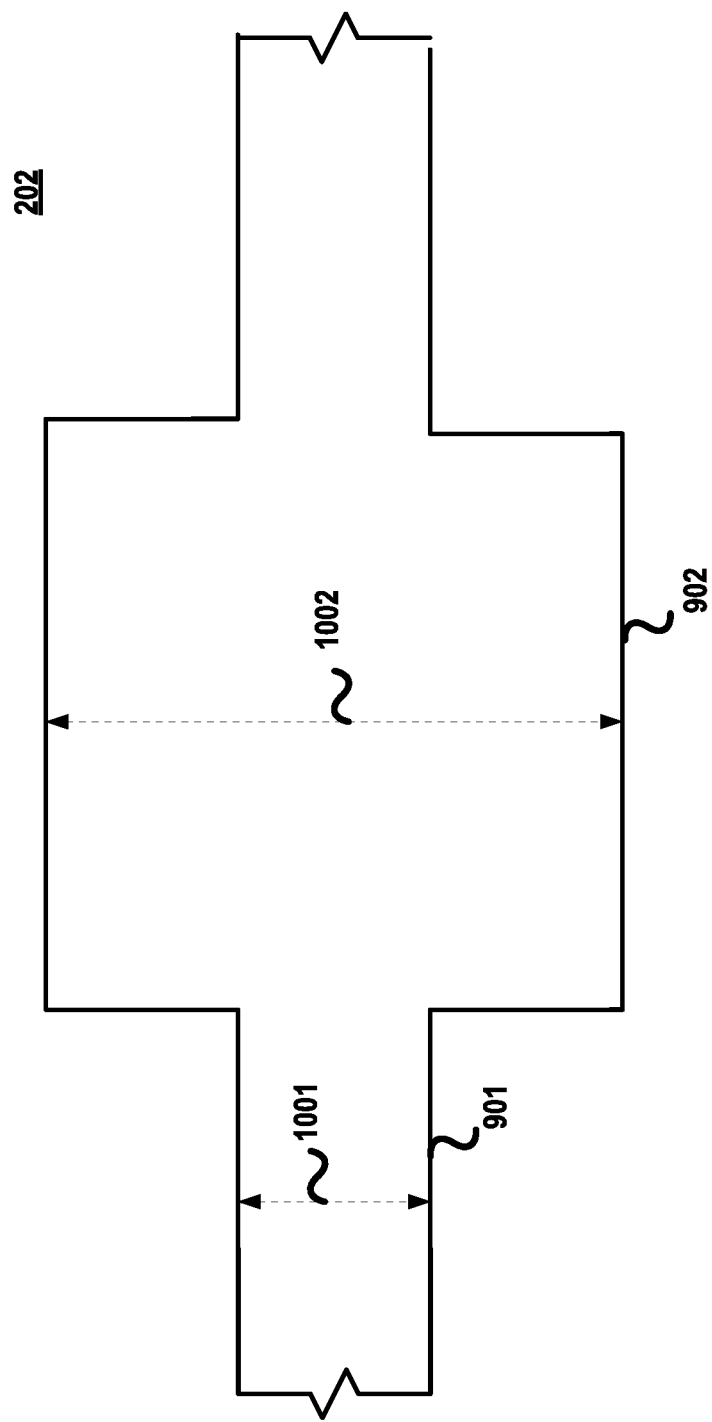
FIG. 10 shows a portion of a transmission line of a wireless earphone in accordance with an aspect of the embodiments.

Moreover, in order to mount electrical components along microstrip 202 (for example, a filtering surface mounted device (SMD)), mounting pads (for example pad 902) are formed along microstrip 202. However, even though the SMD's are small, they are wide when compared to the width of section 901. (This comparison is shown in FIG. 10.) This change in width may disrupt the characteristic impedance of microstrip 202 and consequently introduce RF signal insertion losses, impedance mismatch, and lower radiated power by the antenna element.

In order to mitigate the impedance change, embodiments may utilize cutouts 903 and 904 at layer 7 so that the ground plane is moved from layer 7 to layer 6. Consequently, the separation of the ground plane for portions of mounting pad 902 is increased from distance 751 to distance 751+distance 752+distance through additional PCB layers if necessary (as shown in FIG. 7). The cutouts 903 and 904 are specifically optimized relative to selected RF ground layer and to take into consideration PCB layout stackup and the dielectric constant FIG. 10 shows a portion of a microstrip 202, as shown in FIG. 9, in accordance with an aspect of the embodiments. Microstrip 202 is a type of transmission line, where the characteristic impedance is related to the W/D, W is the width of the microstrip, and D is the distance to the ground plane.

If D were the same along sections 901 and 902 (where sections 901 and 902 have widths 1001 and 1002, respectively) and section 901 has a characteristic impedance of 50 ohms (for example, where the ground plane is located at layer 7), then the characteristic impedance of section 902 could be significantly different from 50 ohms. Consequently, optimized geometry and size cutouts at layer 7 would properly reference the ground plane to layer 6 or layers below through additional cutouts Referring to the embodiment shown in FIG. 9, computer simulations and experimentation estimate a reflection loss of −18 dB and an insertion loss of −0.2 dB with cutouts. However, for the same embodiment but without cutouts, the reflection loss is −11 dB and an insertion loss of 0.5 dB. Based on the above results, the performance improvement provided by the cutouts is significant.

Figure 11:
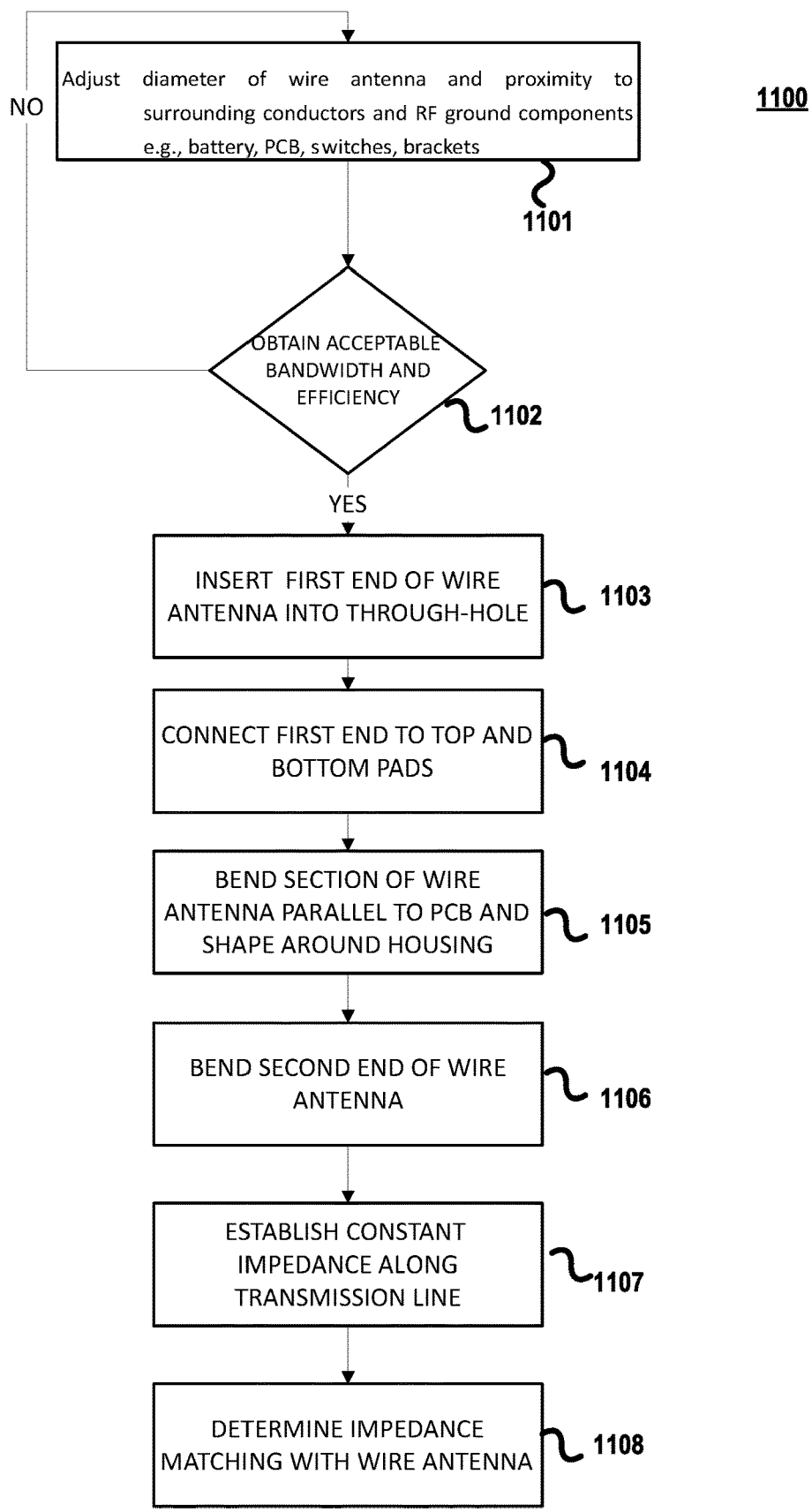
FIG. 11 shows a process for implementing a wireless earphone in accordance with an aspect of the embodiments.

FIG. 11 shows process 1100 for implementing wireless earphone 101 in accordance with an aspect of the embodiments.

At block 1101, the wire diameter of wire antenna 301 is determined. Because the distance of antenna 301 to the ground plane (as provided by PCB 401) is restricted by the thin profile of earphone 101, the wire diameter may significantly affect the distance. The diameter may be determined based on a performance metric (for example, defined by EQ. 1). When an acceptable antenna bandwidth and efficiency tradeoff is obtained, as determined at block 1102 and where the antenna shape and wire diameter is often driven by an Industrial Design (ID) form factor, process 1100 proceeds with the assembling configuration of antenna 301 in the housing of wireless earphone 101.

A first end of antenna 301 is inserted into through-hole 601 of PCB 401 at block 1103 and electrically connected (for example, soldered) to top and bottom pads at block 1104.

Because antenna 301 must fit within the thin profile of the housing, antenna 301 is bent to transition to a horizontal orientation and is shaped to curve around the housing (and typically away from a battery) at block 1105.

In order to avoid close proximity to the battery, a sharp bend is introduced at the second end of antenna at block 1106. However, consideration must be accorded so that the bend does not cause current cancelations with other portions of antenna 301, thus degrading the performance of antenna 301.

At block 1107, a constant impedance is maintained (with respect to traditional approaches) along microstrip 202 that connects radio device 201 and antenna 301 by forming cutouts along microstrip 202 and under associated components.

At block 1108, the VIA PCB stack-up geometry is determined to obtain partial impedance matching with antenna 301 and microstrip 202. Further impedance matching is obtained using a shunt capacitor that is connected to the antenna port.

Figure 12:
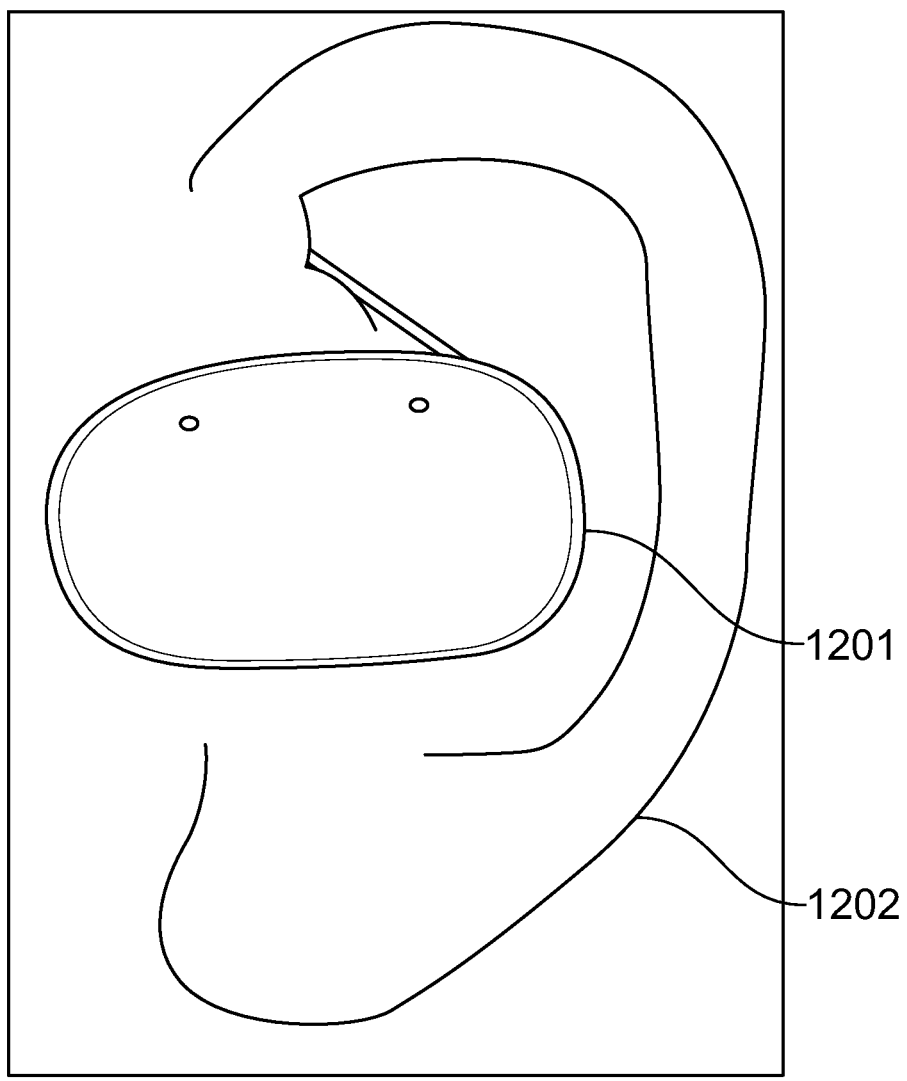
FIG. 12 shows a wireless earphone worn by a user in accordance with an aspect of the embodiments.

FIG. 12 shows wireless earphone 1201 situated in user's ear 1202. Referring back to FIG. 1, rather than being held in place by an external attachment (for example, a hook) at or around the ear, wireless earphone is held in place by an eartip (not explicitly shown) inserted into the user's ear canal.

Figure 13:
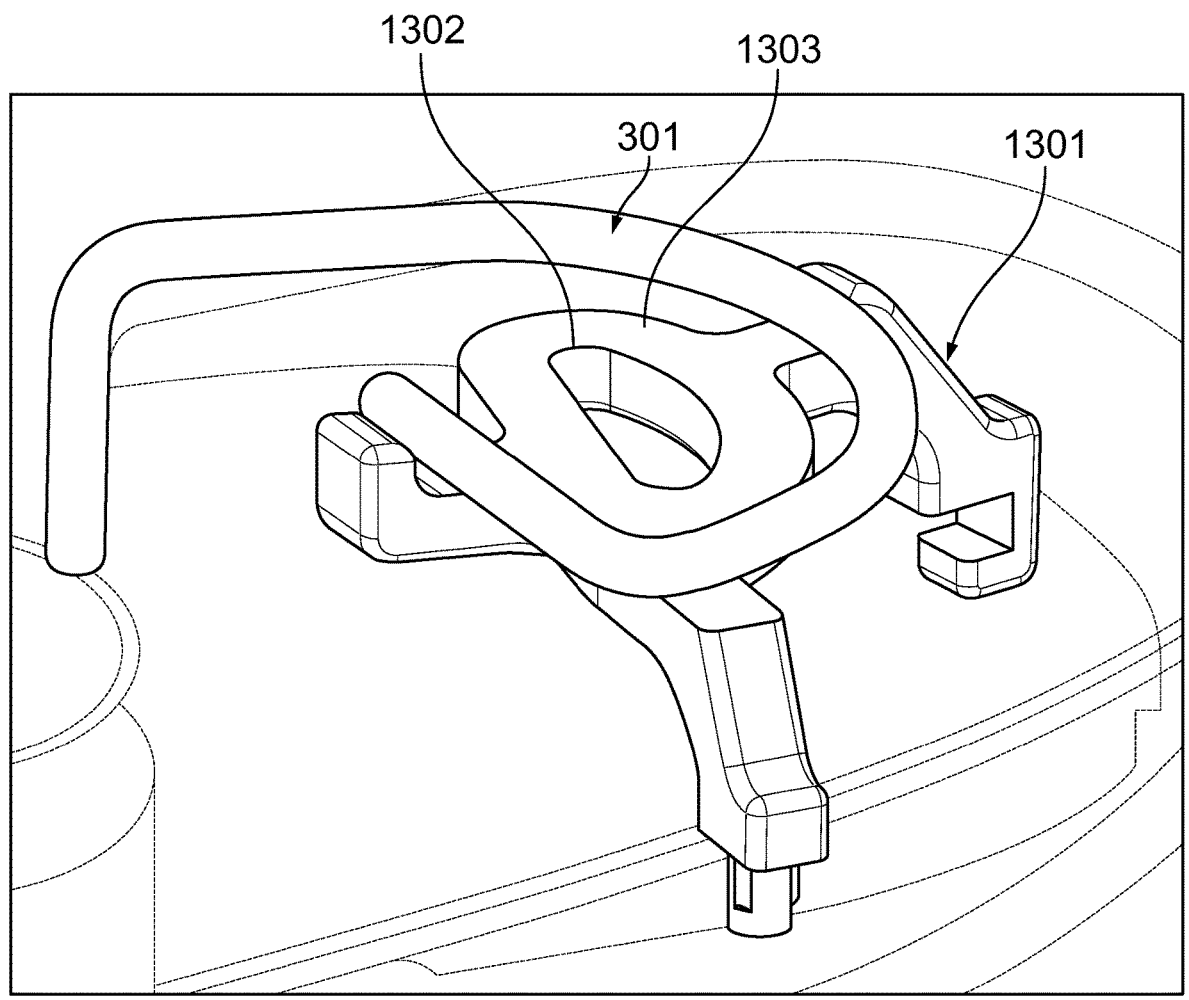
FIG. 13 shows a wire antenna positioned by an antenna holder in accordance with an aspect of the embodiments.

FIG. 13 shows wire antenna 301 positioned by antenna holder 1301 in accordance with an aspect of the embodiments. Antenna holder 1301 is similar to antenna holder 801 as shown in FIG. 8. By keeping the dimensions of hole 1302 the same as those of hole 302 while removing material around periphery 1303 of holder 1301, the resulting electrical characteristics of antenna 301 are essentially the same as antenna holder 801 (within a predetermined difference).

Figure 14:
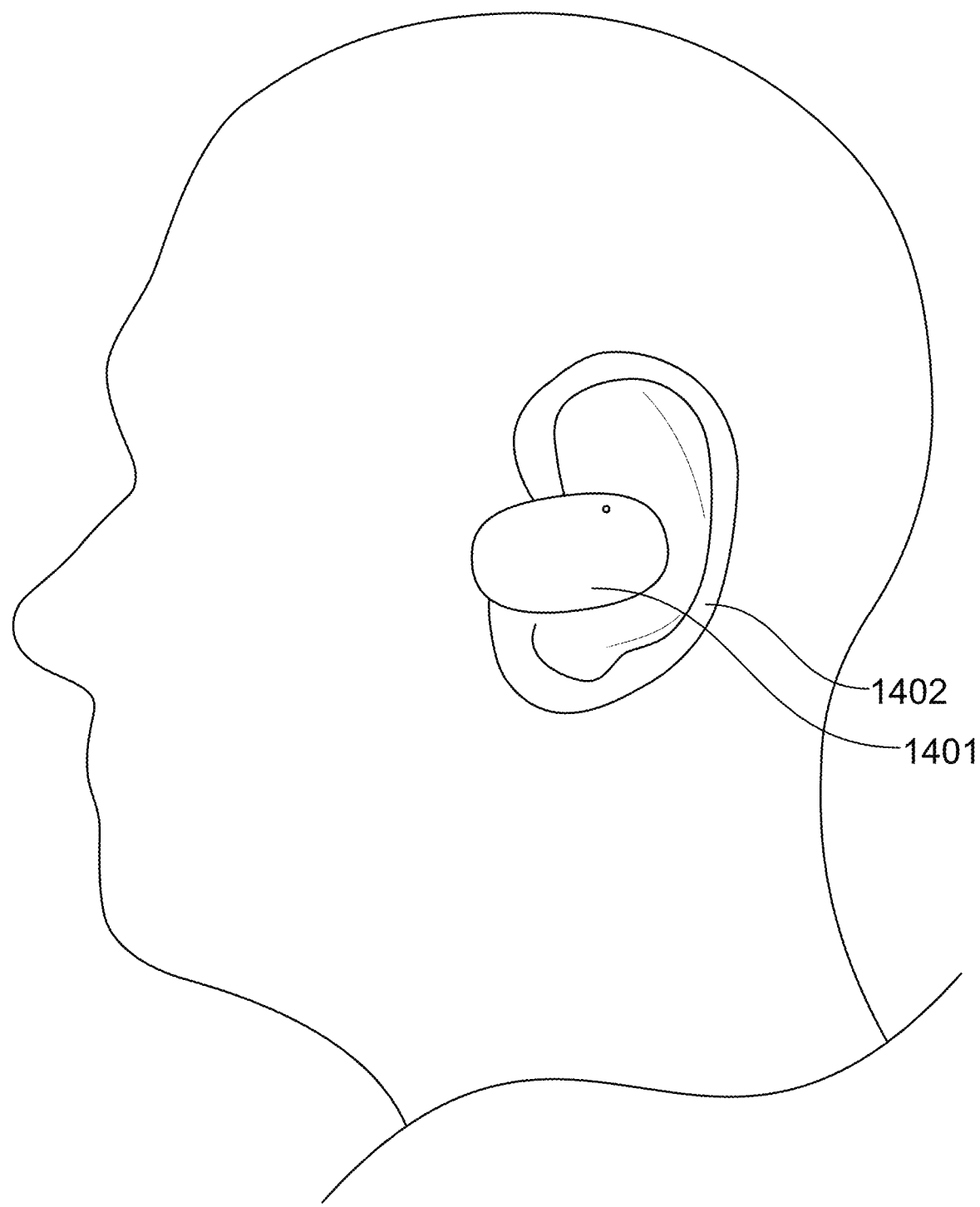
FIGS. 14-15 show aspects of the disclosure in which the effects of user interaction upon antenna detuning are reduced.
Figure 15:
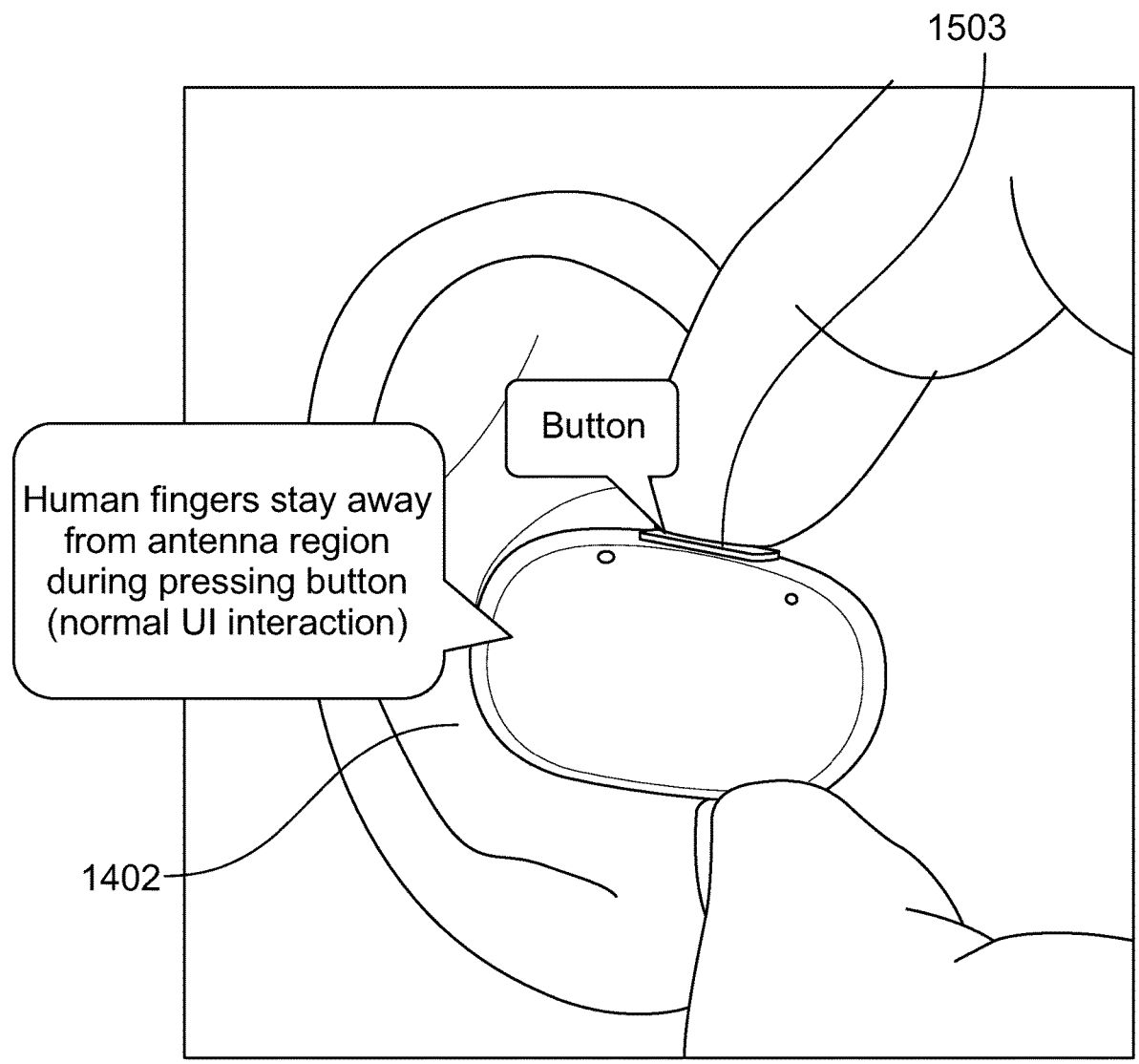

As previously discussed, the form factor of an antenna may reduce antenna detuning caused by user interactions. FIG. 15 further show aspects of the disclosure in which the effects of user interaction upon antenna detuning are reduced. As shown in FIG. 14, wireless earphone 1401 is inserted into ear 1402 of a user. The user interacts with earphones through button 1503 as shown in FIG. 15. The effects of user interaction may be reduced in several ways. First, the unobstructed area around the antenna of wireless earphones 1401 significantly reduces antenna detuning. Second, button 1503 is positioned so that fingers of the user stay away from the antenna region when pressing button 1503 during normal user interaction. Third, the counterforce at the bottom of the unit is required while pressing the top UI button for the earphones to stay comfortably in user ear. The design allows for natural thumb placement during this interaction such that it does not significantly detune the antenna.

Antenna detuning may be characterized by a predetermined frequency deviation that is based on a percentage from the intended center frequency of antenna 301 (as shown in FIG. 3). For example, the predetermined frequency deviation may be ½ percent, 1 percent, 2 percent, or 5 percent (corresponding to 12 MHz, 24 MHz, 48 MHz, 120 MHz, respectively) from the intended center frequency of 2.4 GHz.

In order to be within a predetermined frequency deviation, button 1503 is exposed through the housing and configured to provide interaction of a user with the wireless earphone, where button 1503 is positioned so that the user's fingers are separated from antenna 301 greater than a predetermined distance when the user presses the user input device during normal user interaction. For example, button 1503 may be located at least 0.5 inches, 0.2 inches, or 0.1 inches from antenna 301 in order to obtain varying degrees of antenna detuning.

Embodiments may support other types of user interface devices other than button 1503. For example, a user interface device may comprise a capacitive sensor that is responsive to a user's finger touching or in close proximity to the sensor.

Antenna 301 may be mounted on PCB 401 (as shown in FIG. 4) within an unobstructed area of the PCB that is void of relatively large, metallic electrical components that may detune antenna 301. For example, a relatively large component may have one or dimensions that is greater than 0.01λ or 0.02λ or 0.05λ, where λ is the operating wavelength. As shown in FIG. 3, antenna 301 is mounted away from battery 302.

As shown in FIG. 15, button 1503 is exposed through the top of the housing. However, button may be exposed through different positions of the housing, for example, through one of the sides or the bottom.

Aspects of the disclosure have been described in terms of illustrative embodiments thereof. Numerous other embodiments, modifications, and variations within the scope and spirit of the appended claims will occur to persons of ordinary skill in the art from a review of this disclosure. For example, one of ordinary skill in the art will appreciate that the steps illustrated in the illustrative figures may be performed in other than the recited order, and that one or more steps illustrated may be optional in accordance with aspects of the disclosure.

EXEMPLARY CLAUSES

1. A wireless earphone for receiving audio content over a wireless communication channel at a desired frequency spectrum, the wireless earphone comprising:
    a multi-layer printed circuit board (PCB);
    an antenna assembly comprising a wire antenna, wherein the wire antenna has a wire length compatible with the desired frequency spectrum, comprises a first end, and is characterized by an antenna radiation resistance and wherein the first end is inserted through a through-hole of the multi-layer PCB; and
    an impedance matching interface utilizing an electrical interaction between the first end of the wire antenna and at least one PCB layer of the multi-layer PCB, wherein the wireless earphone is at least partially matched to an antenna impedance.

2. The wireless earphone of clause 1, wherein the first end of the wire antenna is electrically connected to a top pad of the through-hole and a bottom pad of the through-hole.

3. The wireless earphone of clause 1, wherein the impedance matching interface comprises a shunt capacitor and wherein the wireless earphone is further matched to the antenna impedance by the shunt capacitor.

4. The wireless earphone of clause 1 comprising a housing, wherein a section of the wire antenna is approximately parallel to the multi-layer PCB and is specifically shaped around a portion of the housing.

5. The wireless earphone of clause 4, wherein the wire antenna includes a bend to maintain a minimum distance of a second end of the wire antenna from at least one metallic component of the wireless earphone.

6. The wireless earphone of clause 5, wherein the antenna assembly further comprises an antenna holder and wherein the antenna holder attaches to the section of the wire antenna to support the wire antenna a desired distance from the multi-layer PCB.

7. The wireless earphone of clause 6, wherein the antenna holder includes a hole to reduce an amount of dielectric material, thus to minimize dielectric losses and antenna dielectric loading.

8. The wireless earphone of clause 1 further comprising:
    a radio device; and
    a transmission line configured to electrically connect the radio device to the impedance matching interface, wherein the transmission line includes an electrical component and an associated cutout of a ground plane and wherein the associated cutout is located below the electrical component on an adjacent layer or layers below adjacent layer of the multi-layer PCB.

9. The wireless earphone of clause 1, wherein the desired frequency spectrum spans 2.40 GHz to 2.4835 GHz.

10. The wireless earphone of clause 1, wherein the wire antenna is characterized by a distance-diameter ratio of approximately four, wherein the wire antenna comprises an electrical wire having a diameter and has a spacing distance between a bottom of the electrical wire to the multi-layer PCB.

11. The wireless earphone of clause 10, wherein the electrical wire has the diameter of approximately 0.8 mm and the spacing distance of approximately 3 mm.

12. The wireless earphone of clause 1, wherein each internal PCB layer of the multi-layer PCB has a specific opening to provide a desired contribution to the distributed impedance matching.

13. The wireless earphone of clause 2, wherein the top pad and the bottom pad are aligned to the through-hole and wherein the wire antenna is electrically connected to the top and bottom pads by solder connections.

14. The wireless earphone of clause 13, wherein a first size of the top pad and a second size of the bottom pad provide sufficient mechanical strength for supporting the wire antenna.

15. The wireless earphone of clause 1 further comprising:
    a battery configured to provide electrical power to the wireless earphone through a first lead and a second lead;
    a first ferrite bead electrically connected between the battery and the first lead; and
    a second ferrite bead electrically connected between the battery and the second lead,
    wherein the first ferrite bead and the second ferrite bead are selected to exhibit high impedance in the desired frequency spectrum and wherein the battery electrically floats relative to RF ground at the operational frequency.

16. The wireless earphone of clause 1 further comprising:
a battery configured to provide electrical power to the wireless earphone through a first lead and a second lead;
a first inductor electrically connected between the battery and the first lead; and
a second inductor electrically connected between the battery and the second lead,
wherein the first inductor and the second inductor exhibit a self-resonance at an operational frequency in the desired frequency spectrum and wherein the battery electrically floats relative to RF ground at the operational frequency.

17. The wireless earphone of clause 15, further comprising:
additional ferrite beads electrically connected between the battery and RF ground components such as PCB, e.g. battery control and monitoring lines,
wherein the additional ferrite beads are selected to exhibit high impedance in the desired frequency spectrum.

18. The wireless earphone of clause 16, further comprising:
additional inductors electrically connected between the battery and RF ground components such as PCB, e.g. battery control and monitoring lines,
wherein the additional inductors are selected to exhibit high impedance in the desired frequency spectrum.

19. The wireless earphone of clause 15, wherein the battery includes additional leads.

20. The wireless earphone of clause 16, wherein the battery includes additional leads.

21. A method for supporting wireless communication at a desired frequency spectrum for a wireless earphone, the method comprising:
determining a wire diameter of a wire antenna and an antenna distance to PCB ground plane based on a tradeoff between an antenna bandwidth and a radiation efficiency of the wire antenna;
inserting a first end of the wire antenna through a through-hole of a multi-layer printed circuit board (PCB); and
providing at least a partial impedance matching of the wireless earphone with the wire antenna with a PCB layer specific VIA PCB stack-up geometry.

22. The method of clause 21 further comprising:
bending the wire antenna so that a section of the wire antenna is approximately parallel to the multi-layer PCB; and
shaping the wire antenna around a portion of a housing; and
bending at a second end of the wire antenna to maintain a minimum distance of the second end from at least one metallic component of the wireless earphone.

23. The method of clause 22 further comprising:
establish an approximate constant impedance along a transmission line connecting a radio device to the wire antenna, the maintaining further comprising:
cutting out a portion of a ground plane below an electrical component along the transmission line, wherein the portion is located below the electrical component on an adjacent PCB layer or layers below adjacent layer of the multi-layer PCB.

24. The method of clause 21 further comprising:
electrically connecting the first end of the wire antenna to a top PCB layer and a bottom PCB layer, respectively.

25. The method of clause 21 further comprising:
inserting a shunt capacitance to a feed point of the wire antenna to provide a desired impedance matching of the wireless earphone with the wire antenna in conjunction with the partial impedance matching.

26. A wireless earphone for supporting a wireless communication channel at a desired frequency spectrum, the wireless earphone comprising:
a radio circuit configured to extract audio content from a wireless signal received over the wireless communication channel;
a multi-layer printed circuit board (PCB);
a wire antenna, wherein the wire antenna has a wire length compatible with the desired frequency spectrum, the wire antenna has a first end inserted through a through-hole of the multi-layer PCB, and wire antenna is characterized by an antenna impedance; and
a transmission line electrically connecting the radio circuit with the wire antenna and having an approximate constant impedance along the transmission line, wherein the transmission line includes an electrical component and an associated cutout of a ground plane and wherein the associated cutout is located below the electrical component on an adjacent PCB layer of the multi-layer PCB.

27. The wireless earphone of clause 26, further comprising:
an impedance matching interface, wherein the wireless earphone is at least partially matched to the antenna impedance by an electrical interaction between the first end of the wire antenna and at least one PCB layer.

28. The wireless earphone of clause 26 comprising a housing, wherein a section of the wire antenna is approximately parallel to the multi-layer PCB and is shaped around a portion of the housing.

29. The wireless earphone of clause 28, wherein the wire antenna includes a bend to maintain a minimum distance of a second end of the wire antenna from at least one metallic component of the wireless earphone.

30. The wireless earphone of clause 26, wherein the first end is electrically connected to a top pad of the through-hole and a bottom pad of the through-hole.

31. A wireless earphone for receiving audio content over a wireless communication channel at a desired frequency spectrum, the wireless earphone comprising:
a housing;
a printed circuit board (PCB) located within the housing;
an antenna assembly comprising a wire antenna, wherein the wire antenna has a wire length compatible with the desired frequency spectrum and wherein the antenna assembly is electrically mounted on the PCB within an unobstructed area; and
a user input device configured to provide interaction of a user with the wireless earphone, wherein the user input device is positioned so that fingers of the user are separated from the wire antenna greater than a predetermined distance when the user presses the user input device during normal user interaction,
wherein antenna detuning of the antenna assembly by the normal user interaction is within a predetermined frequency deviation.

32. The wireless earphone of clause 31 further comprising a surface region on the housing configured to accommodate thumb placement of the user, wherein a resulting force applied by a thumb of the user counteracts the pressing of the user input device by the user, 33. The wireless earphone of clause 31 further comprising a battery configured to provide electrical power to the wireless earphone, wherein the wire antenna is characterized by a first bend at an end of the wire antenna to maintain a minimum distance from a battery of the wireless earphone and the fingers of the user during the normal user interaction.

34. The wireless earphone of clause 33, wherein the wire antenna is characterized by a second bend so that the wire antenna is parallel with the PCB.

35. The wireless earphone of clause 34, wherein the wire antenna is characterized by a third bend to accommodate a curved portion of the housing.

36. The wireless earphone of clause 35, wherein the antenna assembly comprises an antenna holder and wherein the antenna holder attaches to the wire antenna at the end and the third bend and supports the wire antenna at a desired distance from the PCB.

37. The wireless earphone of clause 31, wherein the user input device comprises a button.

38. A wireless earphone for receiving audio content over a wireless communication channel at a desired frequency spectrum, the wireless earphone comprising:
   a housing;
   a printed circuit board (PCB) located within the housing;
   an antenna assembly comprising a wire antenna, wherein the wire antenna has a wire length required for antenna resonance at the desired frequency spectrum and wherein the antenna assembly is electrically mounted on the PCB within an unobstructed area of the PCB; and
   a user input device configured to provide interaction of a user with the wireless earphone, wherein the user input device is positioned so that fingers of the user are separated from the wire antenna greater than a predetermined distance when the user presses the user input device during normal user interaction,
   wherein antenna detuning of the antenna assembly by the normal user interaction is within a predetermined frequency deviation.

What is claimed is:

1. A wireless earphone for receiving audio content over a wireless communication channel at a frequency spectrum, the wireless earphone comprising:
   a housing;
   a printed circuit board (PCB) located within the housing;
   an antenna assembly comprising a wire antenna, wherein the wire antenna has a wire length based on the frequency spectrum, and wherein the antenna assembly is electrically mounted on the PCB; and
   a user input device configured to support user interaction with the wireless earphone, wherein the user input device is positioned so that user fingers would be separated from the wire antenna greater than a predetermined distance when the user fingers would press the user input device during the user interaction,
   wherein the antenna assembly is configured for antenna detuning based on the user interaction, and wherein the antenna detuning of the antenna assembly is within a predetermined frequency deviation.

2. The wireless earphone of claim 1, further comprising a surface region on the housing configured to accommodate user thumb placement, wherein a resulting force would be applied by a user thumb to counteract pressing of the user input device.

3. The wireless earphone of claim 1, further comprising a battery configured to provide electrical power to the wireless earphone, wherein the wire antenna comprises a first bend at an end of the wire antenna to maintain a minimum distance from the battery and the user fingers during the user interaction.

4. The wireless earphone of claim 3, wherein the wire antenna comprises a second bend so that the wire antenna is parallel with the PCB.

5. The wireless earphone of claim 4, wherein the wire antenna comprises a third bend to accommodate a curved portion of the housing.

6. The wireless earphone of claim 5, wherein the antenna assembly comprises an antenna holder, wherein the antenna holder attaches to the wire antenna at the end and at the third bend, and wherein the antenna holder supports the wire antenna at a desired distance from the PCB.

7. The wireless earphone of claim 1, wherein the user input device comprises a button.

8. The wireless earphone of claim 7, wherein the button is located a second predetermined distance from the wire antenna to obtain a predetermined amount of the antenna detuning.

9. The wireless earphone of claim 1, wherein the user input device comprises a capacitive sensor that is configured to respond to a user input.

10. The wireless earphone of claim 1, further comprising an eartip, wherein the wireless earphone is configured to be held into place by the eartip without an external attachment.

11. An antenna assembly of a wireless earphone comprising:
   a wire antenna, wherein the wire antenna has a wire length compatible with a frequency spectrum, wherein the antenna assembly is electrically mounted on a printed circuit board (PCB), and the wire antenna comprises a first bend at an end of the wire antenna to maintain a minimum distance from a battery of the wireless earphone and user fingers during user interaction; and
   an antenna holder having a hole for reducing dielectric losses, wherein the antenna holder attaches to the wire antenna and supports the wire antenna at a predetermined distance from the PCB.

12. The antenna assembly of the wireless earphone of claim 11, wherein the wire antenna comprises a second bend so that the wire antenna is parallel with the PCB.

13. The antenna assembly of the wireless earphone of claim 12, wherein the wire antenna comprises a third bend to accommodate a curved portion of a housing of the wireless earphone.

14. The antenna assembly of the wireless earphone of claim 13, wherein the antenna holder attaches to the wire antenna at the end and the third bend.

15. The antenna assembly of the wireless earphone of claim 12, wherein a bottom of the wire antenna is at a predetermined distance from the PCB, wherein the wire antenna has a predetermined diameter, and wherein a distance to diameter ratio is approximately four.

16. A method to reduce effects of user interaction upon antenna detuning of a wireless earphone, the method comprising:
   positioning a user input device so that user fingers would be separated from a wire antenna by greater than a first predetermined distance when the user fingers would press the user input device during user interaction; and
   positioning a bottom of the wire antenna at a second predetermined distance from a printed circuit board, wherein the wire antenna has a predetermined diameter, and wherein a distance to diameter ratio is approximately four.

17. The method of claim 16 further comprising:
supporting a user interface device at a second predetermined distance from the wire antenna to obtain a predetermined amount of the antenna detuning.

18. The method of claim 16 further comprising:
supporting a printed circuit board (PCB) specific radio frequency (RF) VIA geometry having an electrical interaction between an end of the wire antenna and at least one PCB layer of a multi-layer PCB to provide a distributed impedance matching, wherein the wireless earphone is at least partially matched to an antenna impedance.

19. The method of claim 16 further comprising:
establishing an approximate constant impedance along a transmission line connecting a radio device to the wire antenna, wherein the establishing comprises cutting out a portion of a ground plane below an electrical component along the transmission line and wherein the portion is located below the electrical component on an adjacent printed circuit board (PCB) layer or layers below an adjacent layer of a multi-layer PCB.

20. The method of claim 16, further comprising:
positioning a wire antenna to curve away from a battery and to bend so that a length criterion of the wire antenna is satisfied and a threshold distance between the wire antenna and the battery is maintained.

* * * * *